United States Patent [19]

White

[11] Patent Number: 5,016,142
[45] Date of Patent: May 14, 1991

[54] PRINTED CIRCUIT BOARD GUIDE APPARATUS FOR A LIMITED ACCESS AREA

[75] Inventor: Robert C. White, San Diego, Calif.

[73] Assignee: Sundstrand Corporation, Rockford, Ill.

[21] Appl. No.: 558,489

[22] Filed: Jul. 27, 1990

[51] Int. Cl.$^5$ .............................................. H05K 7/14
[52] U.S. Cl. ..................... 361/415; 211/41;
    361/399; 361/415; 361/419; 361/420; 439/64
[58] Field of Search ......................... 174/250, 255, 50;
    206/65, 79, 329; 211/41; 220/329; 248/500;
    439/64, 76, 532, 545, 562, 563; 361/338, 339,
    386, 388, 390, 391, 392, 393, 394, 395, 397, 399,
    412, 415, 417, 419, 420

[56] References Cited

U.S. PATENT DOCUMENTS

| 4,779,744 | 10/1988 | Shely et al. | 211/41 |
| 4,821,149 | 4/1989 | Belanger, Jr. | 361/395 |

FOREIGN PATENT DOCUMENTS

| 1082958 | 6/1960 | Fed. Rep. of Germany | 439/64 |
| 2243263 | 3/1974 | Fed. Rep. of Germany | 174/50 |

*Primary Examiner*—Leo P. Picard
*Assistant Examiner*—Donald A. Sparks
*Attorney, Agent, or Firm*—Antonelli, Terry, Stout & Kraus

[57] ABSTRACT

A printed circuit board guide apparatus for guiding a printed circuit board to a mounted position in an area of limited access including a plurality of first tabs extending from a first edge of the printed circuit board and a plurality of second tabs extending from a second edge of the printed circuit board. The second edge of the printed circuit board is directly opposite to the first edge of the printed circuit board. The present invention also includes first and second guide units disposed in a spaced apart parallel relationship to each other and each guide unit including a plurality of guide tabs extending from a top surface and a ledge extending from a bottom surface parallel to the guide tabs. The guide tabs and the ledge form a channel which extends from a first end of the guide unit to a second end of the guide unit. The first and second tabs of the printed circuit board and the guide tabs of the first and second guide units are arranged for permitting the printed circuit board to be dropped into the first and second guide units and pushed along the channels riding on the ledges to the mounted position within the area of limited access.

17 Claims, 2 Drawing Sheets

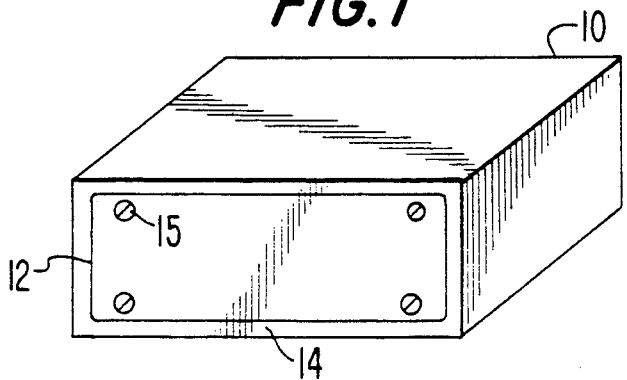
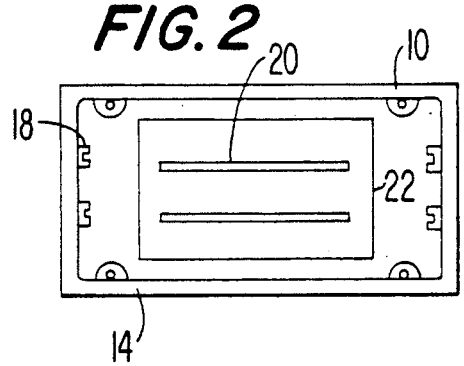
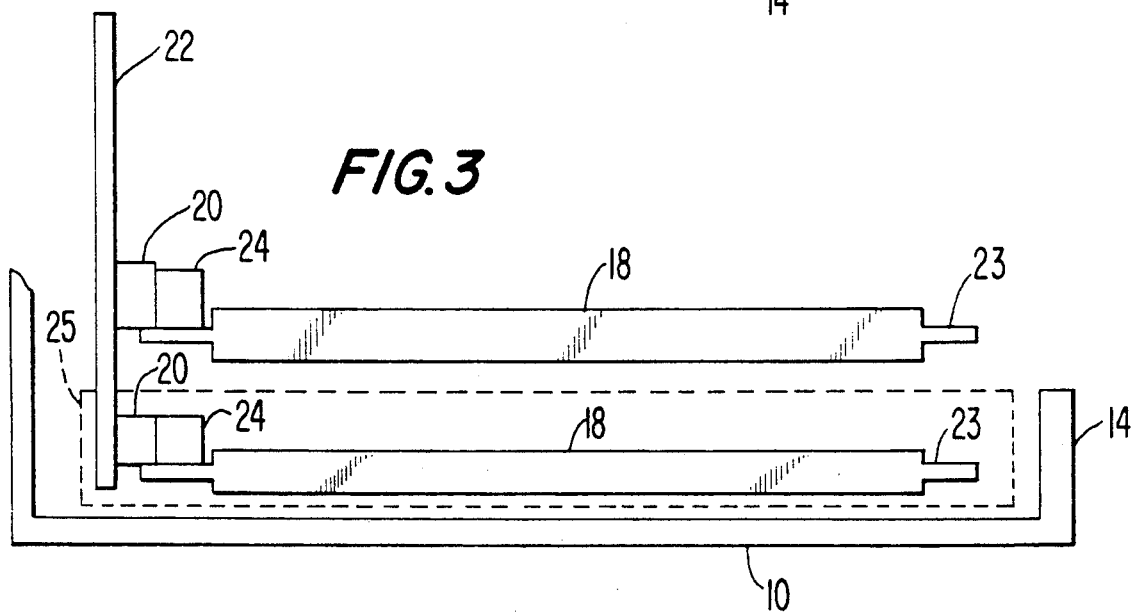

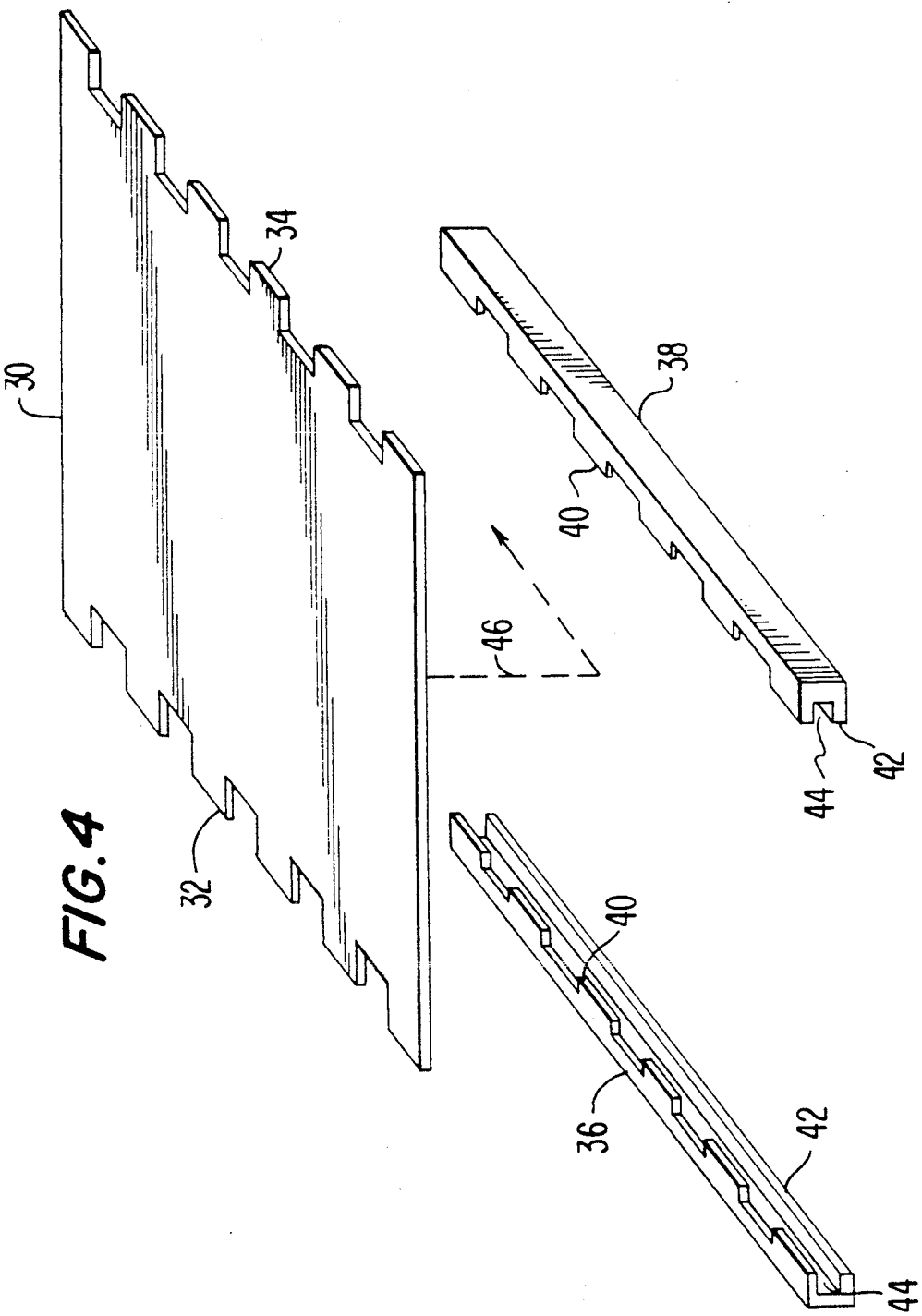

PRINTED CIRCUIT BOARD GUIDE APPARATUS FOR A LIMITED ACCESS AREA

TECHNICAL FIELD

The present invention relates to printed circuit board guide apparatus for guiding a printed circuit board to a mounted position to engage an edge connector. More particularly, the present invention relates to a printed circuit board guide apparatus for guiding a printed circuit board to a mounted position to engage an edge connector in an area of limited access within an electronic enclosure.

BACKGROUND ART

It is well known in the art that printed circuit cards or boards are provided for supporting and interconnecting various electronic components mounted thereon. Printed circuit boards typically are made of a fiberglass sheet of plastic to conform to any size or shape. Conductive strips of material are coated on one side of the printed circuit board for interconnecting the electronic components mounted on the printed circuit board. The electronic components are mounted on the printed circuit board such that input and output terminals of the electronic components are connected to the strips of conductive material.

As known in the prior art, when constructing the physical attributes of an electronic device such as would be used in aerospace applications where space and weight are at a premium electronic, enclosure 10 is used as shown in FIGS. 1, 2, and 3. The electronic enclosure 10 includes an opening plate 12 fastened to a flange 14 on the back surface of the electronic enclosure 10 by fasteners 15 such as screws or the like.

The internal space of the enclosure 10 can be accessed by removing the opening plate 12 as shown in FIG. 2. The internal space of the electronic enclosure 10 includes a plurality of conventional guide rails 18 for guiding a printed circuit board 19 to a mounted position to engage connector 20. The guide rails 18 are mounted on the sides of the enclosure 10. The mounted position is accomplished by mounting the printed circuit boards 19 in the connectors 20 positioned on a mother board 22. A side view of the electronic enclosure 10 having mounted therein printed circuit boards 23 is shown in FIG. 3. Each printed circuit board 19 has mounted thereon a connector 24 which mates with connector 20.

The conventional guide rails 18 used in the electronic enclosure 10 of the installation shown in FIGS. 2 and 3 guides a printed circuit board 23 to the mounted position by permitting the manual sliding of the printed circuit board 23 along the complete length of the guide rails 18.

Due to the manner in which the printed circuit boards 23 are guided to the mounted position by the guide rails 18 of the electronic enclosure 10 efficient use of all available space in the enclosure 10 is not possible. Particularly, it is extremely difficult to install a printed circuit board 23 in a space 25 in the enclosure 10 directly behind the flange 14 due to the manner in which the printed circuit boards 23 are moved to a mounted position using the guide rails 18. In order for printed circuit boards to be installed in guide rails 18 the printed circuit board must be slid along the complete length of the guide rails 18. This manner of installation requires that enough space be available directly in front of the guide rails 18 so that the printed circuit board can be maneuvered into the guide rails 18 and slid to the mounted position along the complete length of the guide rails 18.

Thus, the space within the electronic enclosure 10 is not efficiently used in that the flange 14 causes great difficulty in the positioning of a printed circuit board 23 in the space 25 directly behind the flange 14 in the electronic enclosure 10. The space 25 behind the flange 14 of the electronic enclosure 10 can be described as a limited access area.

Apparatus which is capable of guiding a printed circuit board to the mounted position in a limited access area of an enclosure would offer the advantage of efficiently using the space within an enclosure when space is at a premium in, for example, aerospace applications. Thus, more printed circuit boards can be mounted in the electronic enclosures.

Various conventional printed circuit board guide apparatus have been proposed for guiding a printed circuit board to a mounted position. However, none of the conventional printed circuit board guide apparatus are directed to solving the problem of guiding printed circuit boards to a mounted position in a limited access area.

One proposed method of permitting a printed circuit board to occupy limited access areas in an electronic enclosure is by bolting a printed circuit board to the bottom of the electronic enclosure directly behind the flange of the electronic enclosure. However, such an installation would not permit easy removal of the printed circuit board for servicing. Further, such an installation would provide the opportunity for damage to either the print circuit board or to the connector in which the printed circuit board is mounted.

U.S. Pat. No. 4,821,149 issued on Apr 11, 1989, discloses a substrate (printed circuit board) mounting device for mounting an electrical substrate to a carrier substrate having a first pair of tabs each extending from a perimeter edge of the electrical substrate directly opposite to each other and a second pair of tabs located in a spaced relationship to the first pair of tabs. The second pair of tabs extend from a perimeter edge of the electrical substrate directly opposite each other. In the substrate mounting device of U.S. Pat. No. 4,821,149 first and second substrate guides are located in a spaced and parallel relationship to each other with each including a lower shelf with each lower shelf having a top and bottom surface wherein the bottom surface is mounted to the carrier substrate. Each of the substrate guides of U.S. Pat. No. 4,821,149 further includes a channel having an open end and a top guide and defined by a top surface and first and second drop guides. The first and second drop guides are located on the lower shelf top surface directly opposite the channel top surface. The drop guides include first and second tab receiving slots.

In the substrate mounting device disclosed by U.S. Pat. No. 4,821,149 installation of a substrate is performed by manually inserting the first and second pairs of tabs of the substrate into respective first and second substrate guide channels at respective channel open ends and manually pushing the substrate along the complete length of the channels riding between respective first and second drop guides and channel top surfaces until the substrate encounters a respective top guide. When the top guide is encountered the first pair of tabs and the second pair of tabs fall within respective first and second tab receiving slots.

Thus, as can be clearly seen the device disclosed by U.S. Pat. No. 4,821,149 operates very similar to the conventional printed circuit board guide rails shown in FIG. 2 wherein the printed circuit board must be pushed along the complete length of a channel of the guide rail to a mounted position. The device disclosed by U.S. Pat. No. 4,821,149 differs from the conventional printed circuit board guide rails 18 shown in FIG. 2 in that once a certain point is reached during the sliding of the printed circuit boards in the channels of the guide apparatus disclosed in U.S. Pat. No. 4,821,149 the printed circuit board is permitted to drop into receiving slots.

Thus being that the device disclosed by U.S. Pat. No. 4,821,149 guides a printed circuit board for a mounted position similar to the conventional guide rails 18 shown in FIG. 2, the device cannot be used in an area of limited access such as directly behind a flange in an electronic enclosure.

A further example of printed circuit board guide apparatus is disclosed by U.S. Pat No. 4,779,744 issued on Oct. 25, 1988. The guide apparatus disclosed by U.S. Pat. No. 4,779,744 guides a printed circuit board similar to the conventional printed circuit board guide rails shown in FIG. 2 and the guide apparatus disclosed by U.S. Pat. No. 4,821,149. Thus, the guide apparatus disclosed by U.S. Pat. No. 4,779,744 requires the manual pushing of a printed circuit board along the complete length of the channel of the guide rail.

Therefore, the apparatus disclosed by U.S. Pat. No. 4,779,744 cannot be used in a limited access area directly behind the flange of an electronic enclosure.

DISCLOSURE OF THE INVENTION

The present invention provides a printed circuit board guide apparatus for guiding a printed circuit board to a mounted position to engage a connector in a limited access area. The present invention provides a printed circuit board guide apparatus for guiding a printed circuit board to a mounted position to engage a connector in a limited access area such as the area directly behind the flange of an electronic enclosure.

The present invention is particularly applicable to the aerospace environment where space and weight is at a premium.

In the present invention, the printed circuit board guide apparatus includes a plurality of first tabs extending from a first edge of a printed circuit board and a plurality of second tabs extending from a second edge of the printed circuit board. The second edge of the printed circuit board is directly opposite the first edge of the printed circuit board.

The printed circuit board guide apparatus of the present invention also includes first and second guide units disposed in a spaced apart parallel relationship to either other and each guide unit including a plurality of guide tabs extending from a top surface of the guide unit and a ledge extending from a bottom surface of the guide unit parallel to the guide tabs. The guide tabs and the ledge of the guide units form a channel which extends from a first end of the guide unit to a second end of the guide unit.

The first and second tabs of the printed circuit board and the guide tabs of the first and second guide units are arranged for permitting the printed circuit board to be dropped into the first and second guide units and pushed along the channels riding on the ledges to the mounted position to engage a connector.

The above-described features of the present invention permits its installation in a limited access area directly behind the flange of an electronic enclosure being that it is not necessary to have a large amount of space in front of the guide units to permit a printed circuit board to be pushed along the complete length of the guide units as in the prior art. Instead, in the present invention the printed circuit board may be dropped into the guide units and then pushed a short distance to the mounted position to engage a connector with the printed circuit board sliding on the ledges of the guide units.

BRIEF DESCRIPTION OF THE DRAWINGS

The features of the present invention which are believed to be novel are set forth with particularity in the appended claims. The invention may be best understood, however, by reference to the following description in conjunction with the accompanying drawings in which:

FIG. 1 illustrates an electronic enclosure in which printed circuit boards are installed;

FIG. 2 illustrates the internal space of an electronic enclosure including the flange which prevents access to an area of the enclosure described as a limited access area;

FIG. 3 illustrates the enclosure with conventional guide units and the limited access area; and FIG. 4 illustrates the printed circuit board guide apparatus of the present invention.

BEST MODE FOR CARRYING OUT THE INVENTION

FIG. 1 illustrates a known electronic enclosure 10 into which a plurality of printed circuit boards are installed. The electronic enclosure 10 may be of the type used in aerospace applications. The electronic enclosure 10 includes an opening plate 12 fastened to a flange 14 by a plurality of fastening devices 15 such as screws or the like. When the opening plate 12 is removed the internal space of the enclosure 10 is exposed as shown in FIG. 2.

A plurality of conventional guide rails 18 are mounted on the sides of the enclosure 10 in the internal space thereof. The conventional guide rails 18 guide a printed circuit board to a mounted position to engage connectors 20 which are positioned on a mother board 22 as shown in FIG. 3.

By use of the conventional guide rails 18 shown in FIGS. 2 and 3, printed circuit boards 23 are installed by pushing the printed circuit boards 23 along the complete length of the conventional guide rails 18 until the printed circuit boards 23 are placed in the mounted position to engage connector 20. The manner of installation required by conventional guide rails 18 does not permit the installation of printed circuit boards in an area of limited access directly behind the flange 14 of the electronic enclosure 10.

The printed circuit board guide apparatus of the present invention overcomes this disadvantage by providing printed circuit board guide apparatus which permits the installation of a printed circuit board in the limited access area of an enclosure 10 directly behind the flange 14. The above is accomplished in the printed circuit board guide apparatus of the present invention by providing apparatus which permits the printed circuit board to be dropped into guide units attached to inner sides of the enclosure 10 and pushed a short distance to the mounted position.

The printed circuit board guide apparatus of the present invention is illustrated in FIG. 4.

In FIG. 3 a printed circuit board 30 is provided having a plurality of first tabs 32 extending from a first edge of the printed circuit board 30 and a plurality of second tabs 34 extending from a second edge of the printed circuit board 30. The first and second edges are opposite to each other on the printed circuit board 30.

Also provided in the present invention are a left side guide unit 36 and a right side guide unit 38. The guide units 36 and 38 are disposed in a spaced apart parallel relationship to each other on the inner sides of the enclosure 10. Each guide unit 36 and 38 includes a plurality of guide tabs 40 extending from a top surface of the guide unit 36 and 38. Each guide unit 36 and 38 also includes a ledge 42 which extends from a bottom surface of the guide unit parallel to the guide tabs 40 thereby forming a channel 44 which extends from a first end of the guide unit 36 and 38 to a second end of the guide unit 36 and 38

Each of the plurality of first and second tabs 32 and 34 of the printed circuit board 30 are constructed to be smaller in width than the width of openings between the guide tabs 40 of the guide units 36 and 38. Thus, when dropping the printed circuit board 30 in a vertical direction as shown by dashed arrow 46 the first and second tabs 32 and 34 of the printed circuit board 30 pass through the openings between the guide tabs 40 of the guide units 36 and 38.

Thus in the printed circuit board guide apparatus of the present invention the first and second tabs 32 and 34 of the printed circuit board 30 and the guide tabs 40 of the first and second guide units 36 and 38 are arranged for permitting the printed circuit board 30 to be dropped into the first and second guide units 36 and 38. Further as shown by the dashed line arrow 46 the printed circuit board 30 is pushed along the channels riding on the ledge 42 in a horizontal direction to cause the printed circuit board 30 to be placed in the mounted position.

Therefore, the printed circuit board guide apparatus of the present invention guides a printed circuit board to a mounted position in an area of limited access by permitting the printed circuit board to be dropped into the guide units and then pushed to ride along the ledges of the guide units to the mounted position.

Thus by use of the present invention printed circuit boards can be positioned in the limited access area directly behind the flange 14 of the electronic enclosure 10 as shown in FIG. 2.

While the present invention has been described in terms of its preferred embodiment, it should be understood that numerous modifications may be made of the invention as defined in the appended claims. For example, the present invention may be used in any application which requires a printed circuit board guide apparatus for guiding a printed circuit board to a mounted position. It is intended that all such modifications fall within the scope of the appended claims.

I claim:

1. A printed circuit board guide apparatus for guiding a printed circuit board to a mounted position, comprising:
    a plurality of first tabs extending from a first edge of said printed circuit board;
    a plurality of second tabs extending from a second edge of said printed circuit board, said second edge being directly opposite to said first edge;
    first and second guide units disposed in a spaced apart parallel relationship to each other and each guide unit including a plurality of guide tabs extending from a top surface of said each guide unit and a ledge extending from a bottom surface of said each guide unit parallel to said guide tabs, said guide tabs and said ledge of said each guide unit forming a channel which extends from a first end of said each guide unit to a second end of said each guide unit; and
    said plurality of first and said plurality of second tabs of said printed circuit board and said guide tabs of said first and second guide units being arranged for permitting said printed circuit board to be dropped into said first and second guide units and pushed along said channels riding on said ledges to said mounted position.

2. The printed circuit board guide apparatus according to claim 1, wherein said guide units are disposed on inner sides of an electronic enclosure.

3. The printed circuit board guide apparatus according to claim 2, wherein said electronic enclosure closes electronic devices for use in aerospace applications.

4. The printed circuit board guide apparatus according to claim 3, wherein said mounted position is in an area of limited access within said electronic enclosure.

5. The printed circuit board guide apparatus according to claim 1, wherein said first and second tabs and said guide tabs are of a rectangular shape.

6. The printed circuit board guide apparatus according to claim 1, wherein said mounted position is accomplished by inserting said printed circuit board in a an edge connector.

7. The printed circuit board guide apparatus according to claim 6, wherein said edge connector is positioned on a mother board.

8. A printed circuit board guide apparatus for guiding a printed circuit board to a mounted position within an area of limited access of an electronic enclosure, comprising:
    a plurality of first tabs extending from a first edge of said printed circuit board;
    a plurality of second tabs extending from a second edge of said printed circuit board, said second edge being directly opposite to said first edge;
    first and second guide units disposed in a spaced apart parallel relationship to each other and each guide unit including a plurality of guide tabs extending from a top surface of said each guide unit and a ledge extending from a bottom surface of said each guide unit parallel to said guide tabs, said guide tabs and said ledge of said each guide unit forming a channel which extends from a first end of said each guide unit to a second end of said each guide unit; and
    said plurality of first and said plurality of second tabs of said printed circuit board and said guide tabs of said first and second guide units being arranged for permitting said printed circuit board to be dropped into said first and second guide units and pushed along said channels riding on said ledges to said mounted position, thereby causing said printed circuit board to be mounted in said area of limited access of said electronic enclosure.

9. The printed circuit board guide apparatus according to claim 8 wherein said guide units are disposed on inner sides of said electronic enclosure.

10. The printed circuit board guide apparatus according to claim 8, wherein said first plurality of tabs and said second plurality of tabs and said guide tabs are of a rectangular shape.

11. The printed circuit board guide apparatus according to claim 8, wherein said mounted position is accomplished by inserting said printed circuit board in an edge connector.

12. The printed circuit board guide apparatus according to claim 11, wherein said edge connector is positioned on a mother board.

13. A printed circuit board guide apparatus for guiding a printed circuit board to a mounted position within an area of limited access of an electronic enclosure directly behind a flange surrounding an opening of said electronic enclosure, comprising:

a plurality of first tabs extending from a first edge of said printed circuit boards;

a plurality of second tabs extending from a second edge of said printed circuit board, said second edge being directly opposite to said first edge;

first and second guide units disposed in a spaced apart parallel relationship to each other and each guide unit including a plurality of guide tabs extending from a top surface of said each guide unit and a ledge extending from a bottom surface of said each guide unit parallel to said guide tabs, said guide tabs and said ledge of said each guide unit forming a channel which extends from a first end of said each guide unit to a second end of said each guide unit; and said plurality of first and said plurality of second tabs of said printed circuit board and said guide tabs of said first and second guide units being arranged for permitting said printed circuit board to be dropped into said first and second guide units and pushed along said channels riding on said ledges to said mounted position, thereby causing said printed circuit board to be mounted in said area of limited access of said electronic enclosure directly behind said flange of said electronic enclosure.

14. The printed circuit board guide apparatus according to claim 13, wherein said guide units are disposed on a inner sides of said electronic enclosure.

15. The printed circuit guide apparatus according to claim 13, wherein said first plurality of tabs and said second plurality of tabs and said guide tabs are of a rectangular shape.

16. The printed circuit board guide apparatus according to claim 13, wherein said mounted position is accomplished by inserting said printed circuit board in an edge connector.

17. The printed circuit board guide apparatus according to claim 16, wherein said edge connector is positioned on a mother board.

* * * * *